United States Patent
Chen et al.

(10) Patent No.: US 8,040,674 B2
(45) Date of Patent: Oct. 18, 2011

(54) HEAT DISSIPATION MODULE AND FAN THEREOF

(75) Inventors: Chin-Ming Chen, Taoyuan Hsien (TW);
Yu-Hung Huang, Taoyuan Hsien (TW);
Chih-Hao Hsia, Taoyuan Hsien (TW);
Shu-Hui Chan, Taoyuan Hsien (TW);
Hao-Wen Ko, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 4 days.

(21) Appl. No.: 12/102,524

(22) Filed: Apr. 14, 2008

(65) Prior Publication Data
US 2009/0168351 A1    Jul. 2, 2009

(30) Foreign Application Priority Data
Dec. 26, 2007  (TW) .............................. 96150234 A

(51) Int. Cl.
*H05K 7/20* (2006.01)
*F28F 7/00* (2006.01)
*H01L 23/34* (2006.01)
*F04D 29/044* (2006.01)
(52) U.S. Cl. ....... 361/697; 361/695; 165/80.3; 165/185; 174/16.3; 257/722; 415/206

(58) Field of Classification Search .................. 361/694, 361/695, 697; 165/80.3, 185; 174/16.1, 174/16.3; 29/890.03; 257/717–719, 722; 415/206; 416/223 E, 238, 243, 179, 182
See application file for complete search history.

(56) References Cited

U.S. PATENT DOCUMENTS

| | | | | |
|---|---|---|---|---|
| 5,582,506 A * | 12/1996 | Hong | ............................. | 415/177 |
| 6,053,242 A * | 4/2000 | Hsieh | ............................. | 165/121 |
| 6,304,446 B1 * | 10/2001 | Hsieh | ............................. | 361/697 |
| 6,404,634 B1 * | 6/2002 | Mann | ............................. | 361/704 |
| D581,375 S * | 11/2008 | Chen et al. | ..................... | D13/179 |
| D585,976 S * | 2/2009 | Chen et al. | ..................... | D23/413 |
| 2004/0047129 A1 * | 3/2004 | Simon et al. | .................. | 361/697 |
| 2005/0276694 A1 * | 12/2005 | Su | ................................. | 415/220 |
| 2006/0133920 A1 * | 6/2006 | Chen | ............................... | 415/76 |

* cited by examiner

*Primary Examiner* — Zachary M Pape
(74) *Attorney, Agent, or Firm* — Muncy, Geissler, Olds & Lowe, PLLC

(57) ABSTRACT

The present invention provides a heat dissipation module and a fan thereof. The heat dissipation module includes a heatsink and a frameless fan. The fan is disposed in the heatsink. The fan includes a motor base, an impeller, a motor and at least one engaging member. The impeller and the motor are disposed on the motor base. The motor drives the impeller to rotate, and the engaging member is extended radially from the motor base. The fan is directly assembled to the heatsink via the engaging member.

19 Claims, 9 Drawing Sheets

HEAT DISSIPATION MODULE AND FAN THEREOF

BACKGROUND OF THE INVENTION

1. Field of the Invention

The present invention relates to a heat dissipation module and a fan thereof, and in particular to a heat dissipation module with high heat dissipating efficiency which can be quickly assembled without using additional tools and excess components.

2. Description of the Related Art

As technology advances, electronic components such as the central processing unit (CPU) or the graphic processing unit (GPU) within a personal computer or a server is being designed to achieve higher working frequencies, resulting in higher power consumption, and therefore producing larger amounts of heat. If the heat cannot be appropriately dissipated. The working efficiency of such electronic components becomes low, or even causes the entire electronic components to be burn down.

To overcome this problem, the conventional method is to apply heat dissipating fins and heat dissipating fans on the electronic components. However, fixing the fans on the heatsink require additional components, such as a plastic cover or screws. FIGS. 1A and 1B are schematic views showing two connection ways for conventional fans and heatsinks. As shown in FIG. 1A, the fan 12a is firstly fixed on the frame 16 by screws, and the frame 16 is fixed to the heatsink 14a. However, excess components are required during the assembling process, which raises manufacturing costs, assembly time and labor costs and further hinders price competitiveness.

Otherwise, as shown in FIG. 1B, the fan 12b is directly fastened on the heatsink 14b by screws 18. However, hand tools lie screw drivers are required to assemble or disassemble the fan 12b, which increases assembly time and relative costs. In addition, if the fan 12b breaks down, the screws 18 must be unscrewed when changing the fan 12b, which results in inconvenience. Furthermore, during the assembling or disassembling process, the holes on the heatsink 14b may also cause problems due to stripped screws.

BRIEF SUMMARY OF THE INVENTION

Accordingly, the present invention provides a heat dissipation module and a fan thereof with high heat dissipating efficiency which requires no excess components or hand tools during assembling or disassembling process.

The present invention provides a fan including a motor base, an impeller, a motor and at least one engaging member. The impeller and the motor are disposed on the motor base. The motor drives the impeller to rotate, and the engaging member is extended radially from the motor base. The fan is directly assembled to a heatsink via the engaging member.

The present invention provides a heat dissipation module including a heatsink and a fan disposed in the heatsink. The fan includes a motor base, an impeller, a motor and at least one engaging member. The impeller and the motor are disposed on the motor base. The motor drives the impeller to rotate, and the engaging member is extended radially from the motor base. The fan is directly assembled to a heatsink via the engaging member.

The present invention provides a heat dissipation module and fan thereof as described, of which the heatsink includes a plurality of first fins, a plurality of second fins and a heat guiding block. The heat guiding block contacts a heat source for dissipating heat from the heat source. The first fins and the second fins are both disposed around the periphery of the heat guiding block, and the second fins are disposed below the first fins. When the fan and the heatsink are assembled, the fan is disposed in a space formed by the first fins, and the motor base is located right above the heat guiding block.

The engaging member is extended radially to form two ribs, and the two ribs are then axially extended to collectively form a bar. An opening is formed between the two ribs, so as to allow the airflow produced by the impeller to pass therethrough. The engaging member further has a protrusion located on the bar and away from a side facing the impeller. When the fan is assembled to the heatsink, the protrusion is inserted in the heatsink.

Each first fin has a notch, and the protrusion of the engaging member is inserted in the notches of at least two adjacent first fins, when the fan is assembled to the heatsink. The location of the notch of each first fin corresponds to the protrusion. The adjacent two first fins engage with each other and are disposed around the periphery of the heat guiding block, and the adjacent two second fins engage with each other and are disposed around the periphery of the heat guiding block. Each first fin is in an L shape, and each second fin is in a reversed L shape.

The heat guiding block is a solid block or a heat column (or called column-shaped heat pipe). The solid column is made of metal or metal alloy. The heat column includes a closed main body, a tube, a capillary structure and a working fluid. The working fluid enters the closed main body through the tube.

Moreover, the bar, the ribs and the protrusion of the engaging member are integrally formed as a single piece. The motor base and the engaging member are also integrally formed as a single piece. The engaging member is a flexible component or made of polymers, such as polyester plastic.

Further, the fan of the present invention can have a plurality of engaging members arranged radially around the motor base. The fan is a frameless fan, and the fan is an axial or a centrifugal fan. The fan further has a speed switch device disposed on the engaging member and coupled to the motor, for switching at least two rotating speeds of the impeller.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
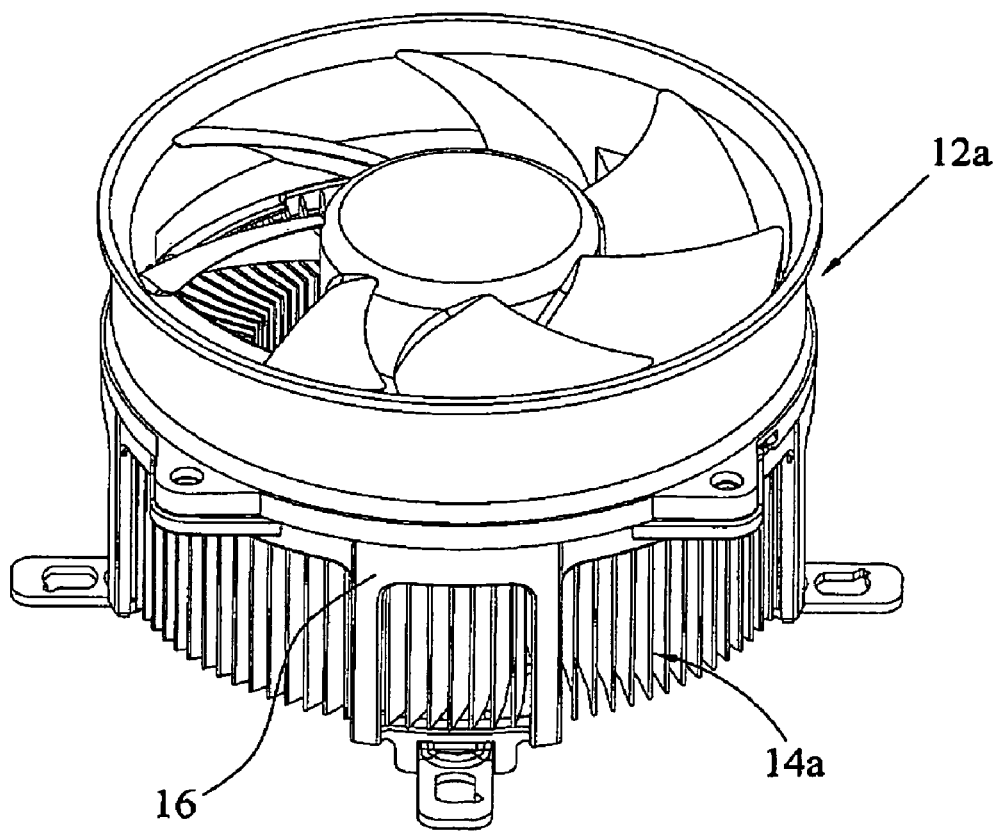
FIGS. 1A and 1B are schematic views showing two connection ways for conventional fans and heatsinks.
Figure 1B:
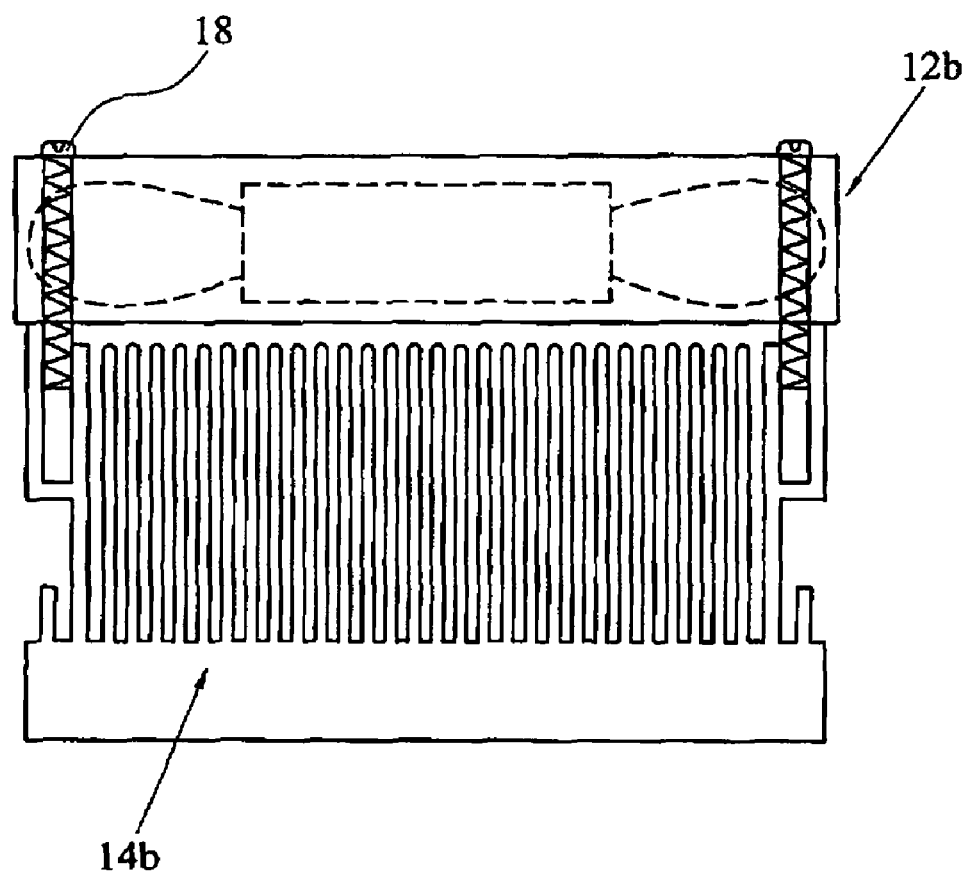
Figure 2A:
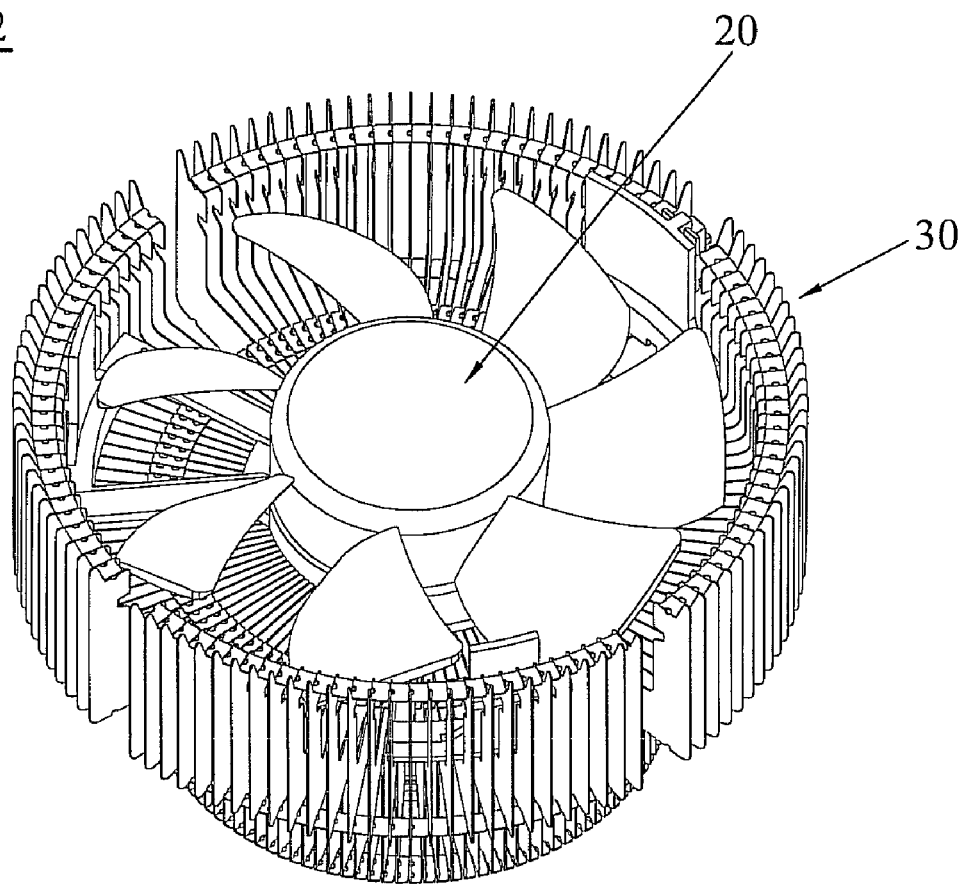
FIG. 2A is a schematic view of a heat dissipation module according to a preferred embodiment of the present invention.

FIG. 2A is a schematic view of a heat dissipation module according to a preferred embodiment of the present invention. The heat dissipation module 2 includes a fan 20 and a heatsink 30. The fan 20 is assembled with and disposed within the heatsink 30. The fan 20 is a frameless fan, and also the fan 20 is an axial fan or a centrifugal fan. The axial fan is shown in the drawing as an example.

Figure 2B:
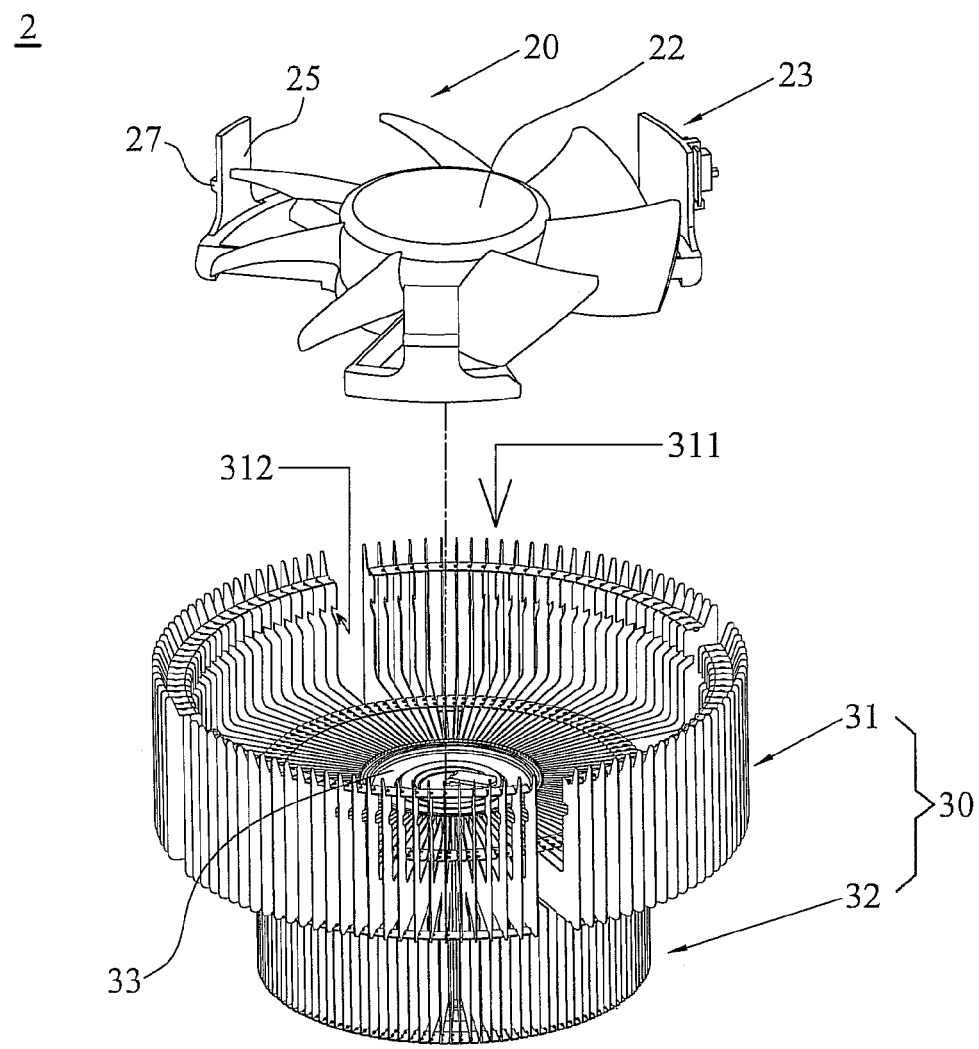
FIG. 2B is an exploded view showing a fan and a heatsink of the heat dissipation module in FIG. 2A.
Figure 3:
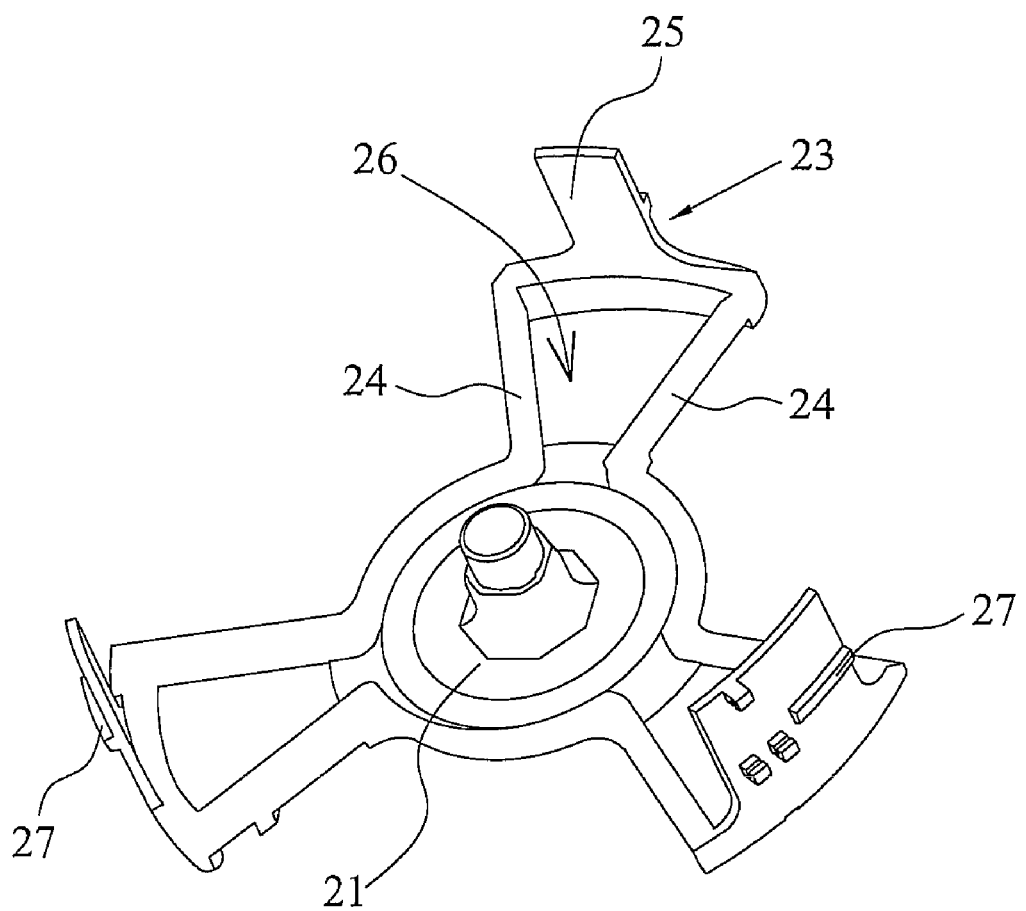
FIG. 3 is a schematic view of a motor base and an engaging member of the fan in FIG. 2B.

Referring to FIGS. 2B and 3, FIG. 2B an exploded view showing a fan and a heatsink of the heat dissipation module in FIG. 2A, and FIG. 3 is a schematic view of a motor base and an engaging member of the fan in FIG. 2B. The fan 2 includes a motor base 21, an impeller 22, a motor (not shown) and at least one engaging member 23. Here, the fan 2 has three engaging member 23. The impeller 22 and the motor are both disposed on the motor base 21. The motor drives the impeller 22 to rotate. The engaging member 23 is extended radially from the motor base 21. In the embodiment, the fan 20 includes three engaging members 21, and the engaging members 23 are extended radially from the motor base 21. It should be noted that the number of engaging members 23 is set according to product requirements and is not limited thereto.

Each engaging member 23 is extended radially and horizontally to form two ribs 24. The two ribs 24 are then extended upwardly to collectively form a bar 25. An opening 26 is formed between the two ribs 24, allowing an airflow produced by the impeller 22 to pass therethrough. When the fan 20 is assembled to the heatsink 30, the airflow is able to circulate within a large space due to the frameless fan 20 and the opening 26 between the two ribs 24. The heatsink 30 below the fan 20 is cooled by the airflow generated by the rotating impeller 22 so as to improve convection ability and achieving high heat dissipation efficiency.

Figure 4A:
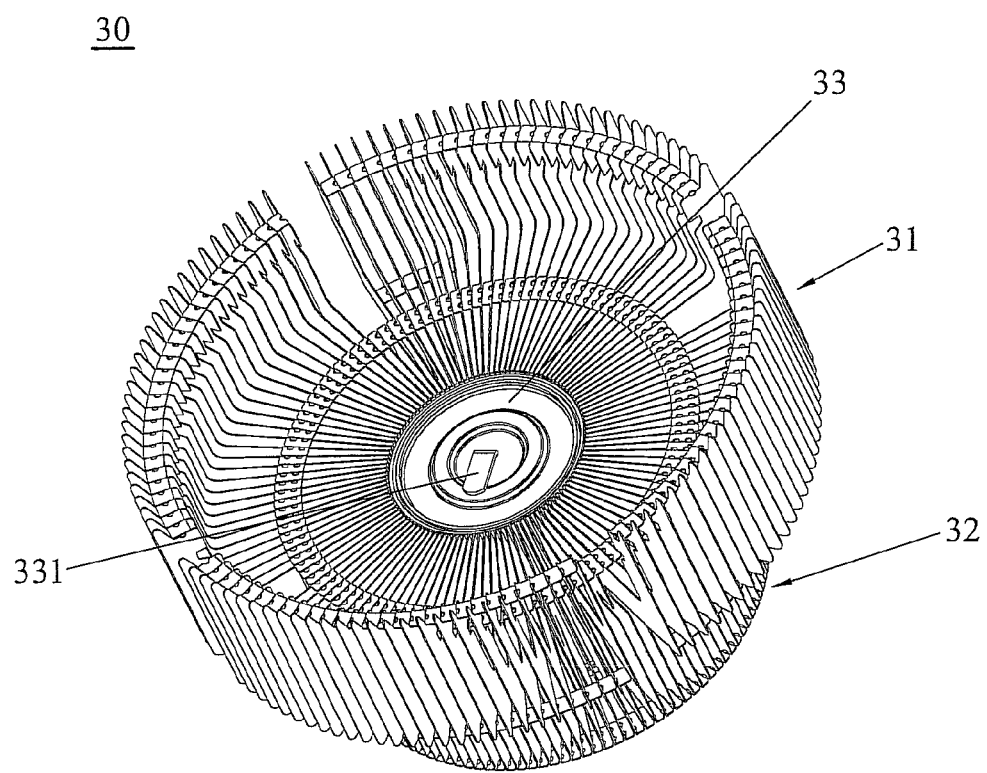
FIG. 4A is a schematic view showing another perspective of the heatsink in FIG. 2B.
Figure 4B:
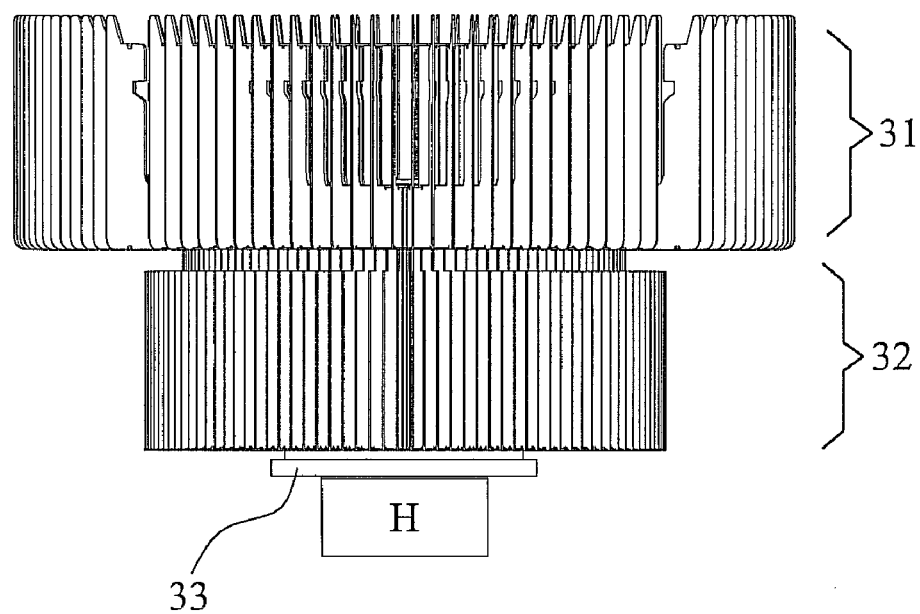
FIG. 4B is a lateral view of the heatsink in FIG. 2B.

Referring to FIGS. 2B, 4A and 4B, FIG. 4A is a schematic view showing another perspective of the heatsink in FIG. 2B, and FIG. 4B is a lateral view of the heatsink in FIG. 2B. The heatsink 30 includes a plurality of first fins 31, a plurality of second fins 32 and a heat guiding block 33. The heat guiding block 33 directly contacts a heat source "H" below the heatsink 30 (as shown in FIG. 4B) to dissipate heat produced from the heat source. The heat source is a central processing unit (CPU), a transistor, a server, a high-level graphic card, a hard drive, a power supply, a traffic control system, a multimedia electronic apparatus, a wireless router or a high-level game machine and so on.

The first fins 31 and the second fins 32 are both disposed around a periphery of the heat guiding block 33, and the second fins 32 are below the first fins 31. In other words, the first fins 31 are disposed on an upper portion of the periphery of the heat guiding block 33, and the second fins 32 are disposed on a lower portion of the periphery of the heat guiding block 33. Referring to FIG. 2B, the heatsink 30 has a round cup-shaped structure forming a receiving room 311. When the fan 20 is assembled to the heatsink 30, the fan 20 is disposed within the receiving room 311 formed by the first fins 31, and the motor base 21 is located right above the heat guiding block 33, as shown in FIG. 2B.

Figure 2C:
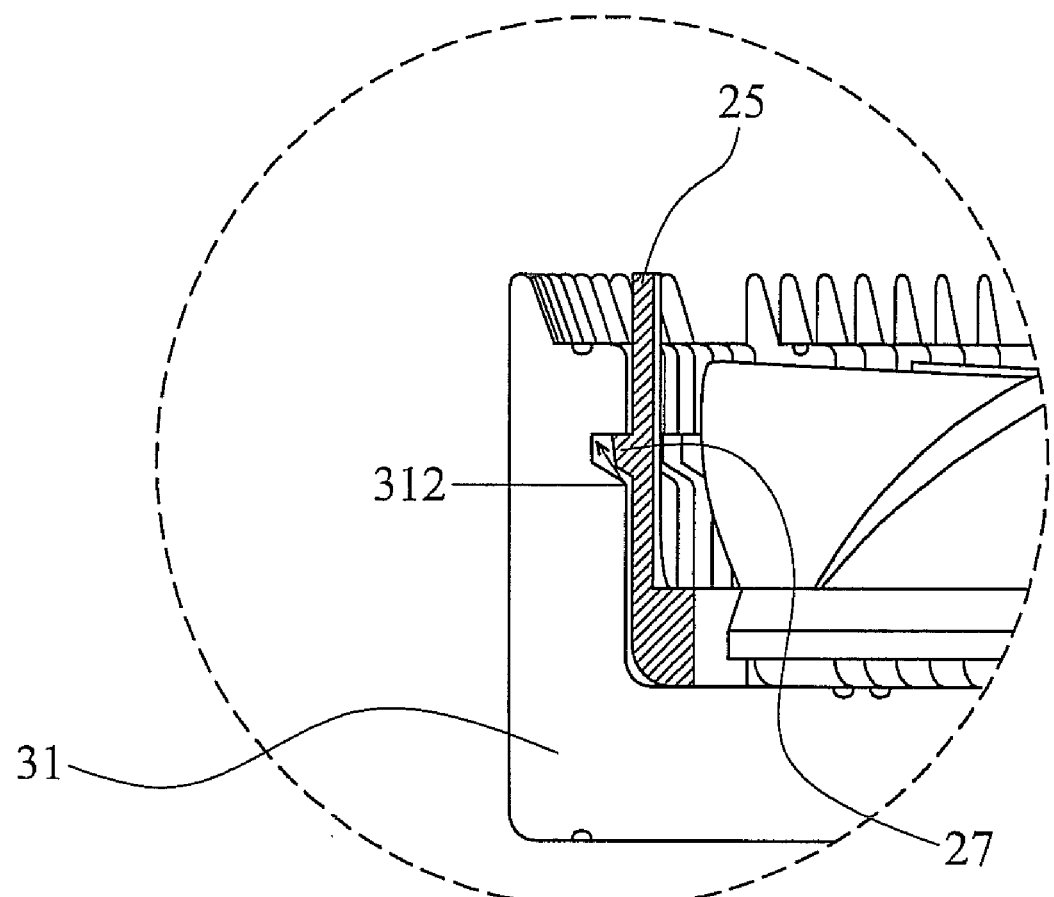
FIG. 2C is a sectional view of a part of the assembled fan and the heatsink in FIG. 2A.

When the fan 20 is assembled to the heatsink 30, the fan 20 is directly assembled to the heatsink 30 via the engaging member 23. Referring to FIGS. 2B and 3 again, each engaging member 23 further has a protrusion 27 which is located on the bar 25 and away from a side facing the impeller 22 (as shown in FIG. 3). When the fan 20 is assembled to the heatsink 30, the protrusion 27 of each engaging member 23 is inserted in the heatsink 30 (as shown in FIG. 2B and FIG. 2C). In addition, the bar 25, the ribs 24 and the protrusion 27 are integrally formed as a single piece, and the motor base 21 and the engaging member 23 are also integrally formed as a single piece. The engaging member 23 is a flexible component or made of polymers, such as polyester plastic.

The assembling process of the fan and the heatsink is described hereafter. Referring to FIGS. 2B and 2C, FIG. 2C is a sectional view of a part of the assembled fan and the heatsink in FIG. 2A. Each first fin 31 has a notch 312, and the location of the notch corresponds to the protrusion 27. Because multiple first fins 31 are disposed around the periphery of the heat guiding block 33, the notches 312 of the multiple first fins 31 combine to form an annular recess for the protrusion 27 of the engaging member 23 to be disposed therein, which allows the fan 20 and the heatsink 30 to be assembled in any direction. Under this circumstance, the protrusion 27 of each engaging member 23 is inserted in at least two notches 312 of the adjacent two first fins 31 at the same time, which achieves the effect of stabilizing the connection between the fan 20 and the heatsink 30.

When exchanging or disassembling the fan 20, the first fin 31, having elasticity, connected to the engaging member 23 is slightly pulled outwardly, and the protrusion 27 of the engaging member 23 is easily separated from the notches 312 of the first fins 31. The fan 20 is easily disassembled after the protrusions 27 of all the engaging members 23 are separated from the notches 312 of the first fins 31. As the results, the heat dissipation module of the present invention requires no screws and additional tools to help assemble the fan, and no excess components are required to finish fan assembly, decreasing manufacturing time and saving material and labor costs. Additionally, the heat dissipation module can be quickly assembled.

Referring to FIG. 4B again, the heat guiding block 33 is a heat column (or called column-shaped heat pipe) or a solid block made of metal or metal alloy. The heat column includes a closed main body, a capillary structure, a working fluid and a tube 331. The working fluid is filled in the main body by the tube 331. The capillary structure is attached on the inner surface of the main body. By two-phased change of the working fluid allows heat to dissipate.

The adjacent two first fins 31 engage to each other and are disposed around the periphery of the heat guiding block 33, and the adjacent two second fins 32 engage to each other and are disposed around the periphery of the heat guiding block. Each first fin 31 is in an L shape, and each second fin 32 is in a reversed L shape.

The heat dissipation module and the fan thereof are connected by the engagement between the protrusion of the engaging member and the notches of the first fins. The fan is positioned to avoid vertical shifting. With the aid of multiple engaging members, tight connection is achieved, noise is eliminated and the structure is enhanced. The design of the present invention provides fast assembly of the fan, avoiding use of hand tools and excess components. Additionally, the fan of the present invention has no conventional fan fame, such that the airflow is able to circulate within a large space, achieving high heat dissipation efficiency.

Figure 5:
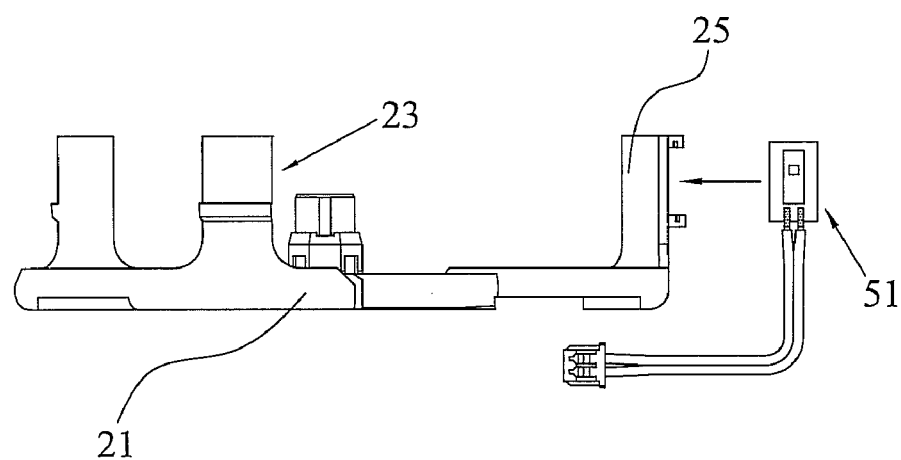
FIG. 5 is a schematic view showing a speed switch device connected to the fan in FIG. 2B.

However, the present invention is not limited to the aforementioned embodiments. Referring to FIG. 5, FIG. 5 is a schematic view showing a speed switch device connected to the fan in FIG. 2B. It should be noted that only the motor base 21 and the engaging member 23 of the fan 20 are shown in FIG. 5 for illustrative clarity. The fan 20 further has a speed switch device which is disposed on the engaging member 23 and is coupled to the motor. One end of the speed switch device 51 is a switch button allowing users to directly controlling by their fingers, and the other end of the speed switch device 51 is a terminal which is coupled to and is electrically connected to a circuit board of the motor on the motor base 21 (not shown).

The speed switch device 51 switches at least two rotating speeds of the impeller 22. That is, when the speed switch device 51 is not turned on, the impeller 22 rotates at a fixed speed, say 2080 r.p.m. for example. Depending on the amount of heat produced, the user can control the speed by turning on the speed switch device 51 for accelerating heat dissipation. That is, the impeller 22 is switched to rotate at another fixed speed, say 2900 r.p.m. for example. Faster heat dissipation is accomplished by providing a higher fan speed.

Furthermore, the fan of the present invention has a signal light or a light emitting diode (LED) on the circuit board. The impeller of the fan is made of a material pervious to light, a translucent material or a transparent material, such as acrylic or polyester plastic. The motor base and the engaging member are also made of the material pervious to light, translucent material or transparent material. As a result, when the impeller rotates, light emitted by the signal light or the light emitting diode is able to penetrate through the impeller, creating an artistic effect. The light can be white light or colored light. Moreover, the number of signal lights or the light emitting diodes on the circuit board is not limited, thus more than two signal lights or light emitting diodes providing different colors can be disposed to present special effects with mixed lights.

While the present invention has been described by way of example and in terms of preferred embodiment, it is to be understood that the present invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fan, comprising a motor base; an impeller disposed on the motor base; and a plurality of engaging members connected to the motor base, wherein the engaging members are spaced apart and each comprises: at least one rib outwardly and radially extended from the motor base; and a bar connected to the rib and extended in an axial direction of the fan; wherein the fan is received in a receiving room of a heatsink, the heatsink has a round cup-shaped structure to form the receiving room, and the bars of each engaging member of the fan include a protrusion that is directly engaged with a notch formed in a plurality of first fins which comprise an inner wall of the round cup-shaped structure of the heatsink which surrounds the receiving room.

2. The fan as claimed in claim 1, wherein the bar is substantially perpendicular to the rib.

3. The fan as claimed in claim 2, wherein each engaging member comprises two ribs, and an opening is formed between the two ribs, which allows an airflow produced by the impeller to pass therethrough, and the bar and the ribs of each engaging member are integrally formed as a single piece.

4. The fan as claimed in claim 2, wherein the protrusion is located on the bar and away from a side facing the impeller; the bar and the rib of each engaging member are integrally formed as a single piece.

5. The fan as claimed in claim 4, wherein the protrusion of each engaging member is engaged with the notches of at least two adjacent first fins when the fan is assembled to the heatsink.

6. The fan as claimed in claim 5, wherein the heatsink further comprises a heat guiding block, and the first fins are disposed around a periphery of the heat guiding block.

7. The fan as claimed in claim 6, wherein the adjacent two first fins engage with each other so as to be disposed around the periphery of the heat guiding block, and each first fin is in an L shape.

8. The fan as claimed in claim 6, wherein the heatsink further comprises a plurality of second fins which are disposed around the periphery of the heat guiding block and below the first fins.

9. The fan as claimed in claim 8, wherein adjacent two second fins engage with each other so as to be disposed around the periphery of the heat guiding block, and each second fin is in a reversed L shape.

10. The fan as claimed in claim 6, wherein when the fan is assembled to the heatsink, the fan is received in the receiving room formed by the first fins, and the motor base is located right above the heat guiding block.

11. The fan as claimed in claim 6, wherein the heat guiding block is a heat column or a solid block comprising metal or metal alloy.

12. The fan as claimed in claim 6, wherein the heat guiding block contacts a heat source to dissipate heat from the heat source, the heat source comprises a central processing unit (CPU), a transistor, a server, a high-level graphic card, a hard drive, a power supply, a traffic control system, a multimedia electronic apparatus, a wireless router or a high-level game machine.

13. The fan as claimed in claim 1, wherein the motor base and the engaging member are integrally formed as a single piece, the engaging member comprises polymers such as polyester plastic, or the engaging member is a flexible component.

14. The fan as claimed in claim 1, wherein the impeller comprises a material pervious to light, a translucent material or a transparent material, such as acrylic or polyester plastic.

15. The fan as claimed in claim 1, further comprising a circuit board disposed on the motor base, wherein at least one signal light or a light emitting diode (LED) is disposed on the circuit board, and the signal light or the LED emits a white light or a colored light.

16. The fan as claimed in claim 1, further comprising a motor and a speed switch device, wherein the motor is dispose on the motor base for driving the impeller to rotate, and the speed switch device is disposed on one of the engaging members and is coupled to the motor for switching at least two rotating speeds of the impeller.

17. The fan as claimed in claim 16, wherein one end of the speed switch device is a switch button allowing users to directly controlling by their fingers, and the other end of the speed switch device is a terminal which is coupled to the motor.

18. The fan as claimed in claim 1, wherein the fan is a frameless fan, and the fan is an axial fan or a centrifugal fan.

19. A heat dissipation module, comprising: a heatsink comprising a round cup-shaped structure forming a receiving room; and a fan received in the receiving room, comprising: a motor base; an impeller disposed on the motor base; and a plurality of engaging members connected to the motor base, wherein the engaging members are spaced apart and each comprises: at least one rib outwardly and radially extended from the motor base; and a bar connected to the rib, extended in an axial direction of the fan and directly engaged with an inner wall of the round cup-shaped structure of the heatsink which surrounds the receiving room; wherein each of the bars comprise a protrusion, the inner wall of the heatsink comprises a plurality of fins, each of which has a notch corresponding to the protrusion, and the protrusion of each engaging member is engaged with the notches of at least two adjacent fins when the fan is assembled to the heatsink.

* * * * *